United States Patent
Sanchez-Fabres Cobaleda et al.

(10) Patent No.: US 10,527,957 B2
(45) Date of Patent: Jan. 7, 2020

(54) METHOD AND APPARATUS FOR PROCESSING A SUBSTRATE IN A LITHOGRAPHIC APPARATUS

(71) Applicant: ASML NETHERLANDS B.V., Veldhoven (NL)

(72) Inventors: Cayetano Sanchez-Fabres Cobaleda, Eindhoven (NL); Franciscus Godefridus Casper Bijnen, Valkenswaard (BE); Edo Maria Hulsebos, Waalre (NL); Arie Jeffrey Den Boef, Waalre (NL); Marcel Hendrikus Maria Beems, Veldhoven (NL); Piotr Michał Stolarz, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/778,517

(22) PCT Filed: Oct. 27, 2016

(86) PCT No.: PCT/EP2016/075913
§ 371 (c)(1),
(2) Date: May 23, 2018

(87) PCT Pub. No.: WO2017/092936
PCT Pub. Date: Jun. 8, 2017

(65) Prior Publication Data
US 2018/0356742 A1    Dec. 13, 2018

(30) Foreign Application Priority Data
Nov. 30, 2015  (EP) .................................... 15196993

(51) Int. Cl.
*G03F 7/20*  (2006.01)
*G03F 9/00*  (2006.01)

(52) U.S. Cl.
CPC ........ *G03F 9/7046* (2013.01); *G03F 7/70141* (2013.01)

(58) Field of Classification Search
CPC ........... H01L 2223/54493; H01L 21/68; G03F 9/7084; G03F 9/7003; G03F 9/7011
See application file for complete search history.

(56) References Cited

U.S. PATENT DOCUMENTS 4,887,904 A    12/1989  Nakazato et al.
5,194,743 A *  3/1993  Aoyama ............. G03F 7/70716
                                                    250/548

(Continued)

FOREIGN PATENT DOCUMENTS

JP    H08298240 A    11/1996
JP    2004063934 A    2/2004

(Continued)

OTHER PUBLICATIONS

PCT/EP2016/075913 International Search Report.

*Primary Examiner* — Steven Whitesell Gordon
(74) *Attorney, Agent, or Firm* — Arent Fox LLP (57) ABSTRACT

A lithographic apparatus has a substrate table on which a substrate is positioned, and an alignment sensor used to measure the alignment of the substrate. In an exemplary processing method, the alignment sensor is used to perform one or more edge measurements in a first step. In a second step, one or more edge measurements are performed on the notch of the substrate. The edge measurements are then used to align the substrate in the lithographic apparatus. In a particular example, the substrate is arranged relative to the alignment sensor such that a portion of the edge surface is positioned at the focal length of the lens. When the align- (Continued)

ment sensor detects radiation scattered by the edge surface at the focal length of the lens, the presence of the edge of the substrate is detected.

13 Claims, 9 Drawing Sheets

(56) References Cited

U.S. PATENT DOCUMENTS

| | | | |
|---|---|---|---|
| 5,644,400 A * | 7/1997 | Mundt | G01B 11/08 |
| | | | 356/150 |
| 6,225,012 B1 * | 5/2001 | Nishi | G03F 7/70691 |
| | | | 430/22 |
| 6,440,821 B1 | 8/2002 | Conboy et al. | |
| 6,549,290 B2 * | 4/2003 | Miura | G01N 21/9501 |
| | | | 250/559.36 |
| 2001/0016293 A1 | 8/2001 | Nishi et al. | |
| 2003/0013303 A1 | 1/2003 | Lin | |
| 2003/0081188 A1 | 5/2003 | Suzuki | |
| 2008/0013089 A1 * | 1/2008 | Ishii | G03F 9/7011 |
| | | | 356/400 |
| 2011/0141463 A1 * | 6/2011 | Chikamatsu | G01N 21/956 |
| | | | 356/237.5 |
| 2015/0227061 A1 | 8/2015 | Tinnemans et al. | |
| 2015/0370175 A1 * | 12/2015 | Nicolaides | G01N 21/9503 |
| | | | 355/77 |

FOREIGN PATENT DOCUMENTS

| | | |
|---|---|---|
| JP | 2011216789 A | 10/2011 |
| WO | 2006025386 A1 | 3/2006 |
| WO | 2015/135782 A1 | 9/2015 |

* cited by examiner

METHOD AND APPARATUS FOR PROCESSING A SUBSTRATE IN A LITHOGRAPHIC APPARATUS

CROSS-REFERENCE TO RELATED APPLICATIONS

This application is the U.S. National Stage Application of International Patent Application No. PCT/EP2016/075913, filed on Oct. 27, 2016 which claims priority of EP application 15196993.8 which was filed on Nov. 30, 2015 both of which are incorporated herein in their entirety by reference.

FIELD

The present invention relates to a method and apparatus for processing a substrate in a lithographic apparatus. In particular the present invention relates to alignment of substrates in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers.

Known alignment sensors use one or several radiation sources to generate a plurality of radiation beams with different wavelengths. In this fashion, a sensor may measure position using several wavelengths (e.g., colors) and polarizations of radiation (e.g., light) on the same target grating or gratings. No single color or polarization is ideal for measuring in all situations, so the system selects from a number of signals, which one provides the most reliable position information.

As substrates become increasingly complex, with increasing numbers of patterns being applied to them, it becomes necessary to add additional wavelengths and/or polarizations in order to ensure the ability of the alignment sensor to provide reliable position information. The addition of more patterns may reduce the amount of light scattered by alignment marks on the substrate. Furthermore, some patterns may be made of materials that are opaque to the wavelengths used by the alignment sensor. To mitigate this, even more complexity must be added to the alignment system. However, given the physical constraints on the alignment sensor, since it has to fit within the lithographic apparatus, may not be feasible or desirable.

Furthermore, methods to increase the visibility of alignment marks to the radiation emitted by the alignment system are time consuming. This slows down the production speed of the lithographic apparatus. Additionally, the methods require additional patterns to be applied, each of which must itself be aligned with the substrate.

SUMMARY

It is desirable to increase the visibility of alignment marks on a substrate without requiring the use of additional processing steps, such as the application of additional patterns or layers to the substrate.

According to an aspect of the invention, there is provided method of processing a substrate in a lithographic apparatus, wherein:

the substrate is positioned on a substrate table configured to move relative to a patterned radiation beam for controllably exposing the substrate to the patterned radiation beam, the substrate comprising an edge and a notch;

and wherein the processing comprises:

determining one or more first quantities indicative of a first location of the edge;

determining one or more second quantities indicative of a second location of the notch; and aligning the substrate within the lithographic apparatus based on the one or more first quantities and the one or more second quantities. The step of determining one or more first quantities may include determining the position of a plurality of points on the edge. The positions of three points on the edge may be determined. The step of determining one or more first quantities may include performing a continuous measurement of the edge.

In one embodiment, the lithographic apparatus comprises a detector with a focal point with a focal length, the detector being arranged to detect light scattered by objects located at the focal point, and wherein the step of determining on or more first quantities comprises:

arranging the substrate relative to the detector such that distance of the surface of the substrate is smaller than the focal length of the detector and such that the distance between the detector and at least a first portion of the edge is substantially equal to the focal length of the detector;

illuminating the edge of the substrate;

receiving light scattered by the edge of the substrate; and detecting the presence of the edge when the detector receives light scattered by the first portion According to a second aspect of the invention, there is provided a lithographic apparatus comprising:

a substrate table for receiving a substrate operable to move relative to a patterned radiation beam for controllably exposing the substrate to the patterned radiation beam, the substrate comprising an edge and a notch;

an optical system operable to:

determine one or more first quantities indicative of a first location of the edge, and determine one or more second quantities indicative of a second location of the notch, wherein the substrate table is further operable to align the substrate within the lithographic apparatus based on the one or more first quantities and the one or more second quantities. The optical system may further be operable to determine the position of a plurality of points on the edge. The optical system may further be operable to determine a position of three points on the edge of the substrate. The optical system may further be operable to perform a continuous measurement of the edge.

According to a third aspect of the invention, there is provided a lithographic system comprising a lithographic apparatus according to the invention as set forth above.

According to a fourth aspect of the invention, there is provided a computer program product containing one or more sequences of machine-readable instructions for implementing steps in a method according to the invention as set forth above.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
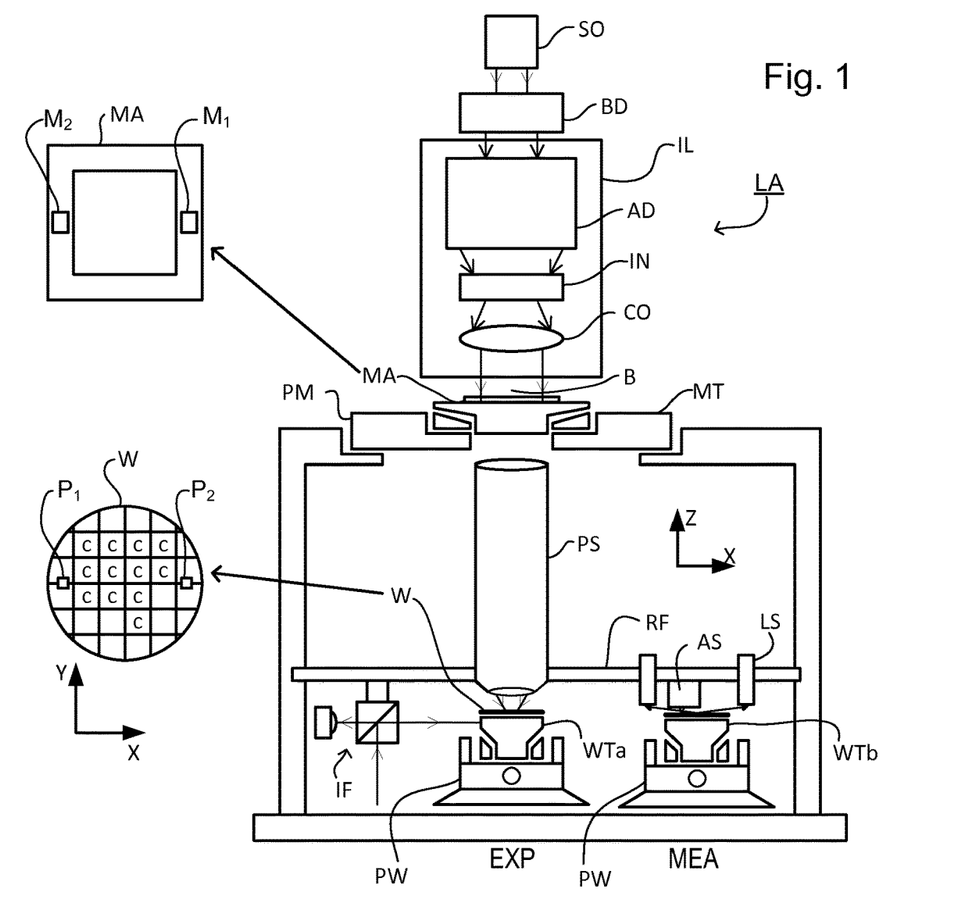
FIG. 1 depicts a lithographic apparatus including an alignment sensor.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
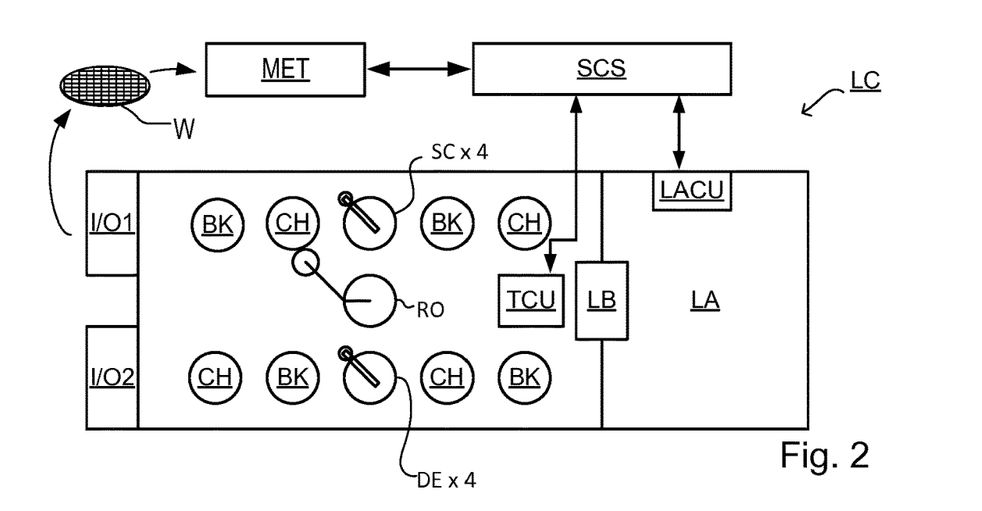
FIG. 2 depicts a lithographic cell or cluster in which an apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 3:
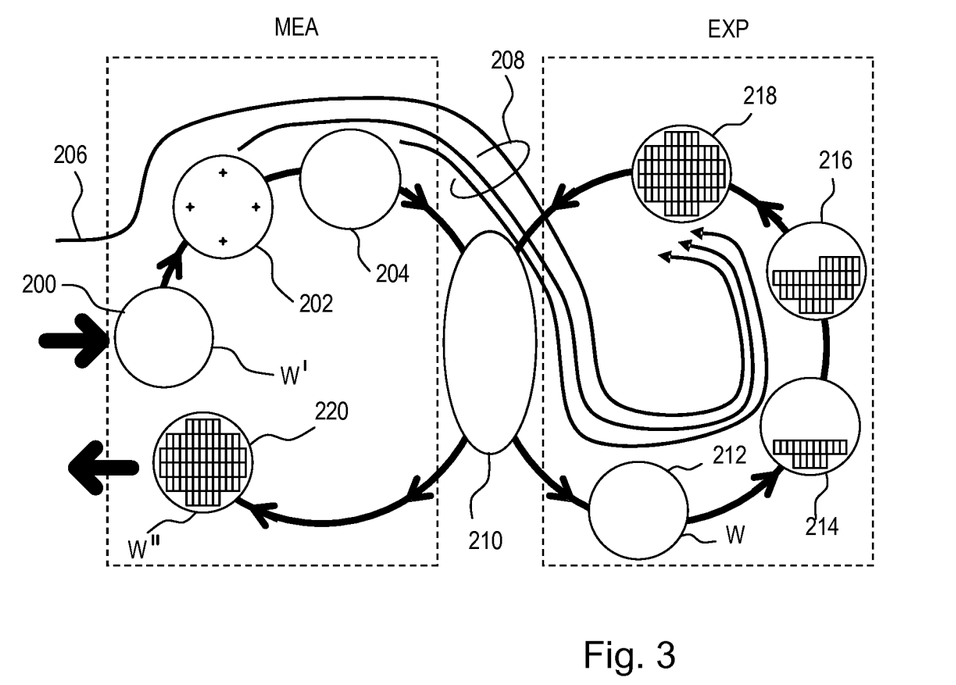
FIG. 3 illustrates the steps to expose target portions (e.g. dies) on a substrate W in the dual stage apparatus of FIG. 1.

FIG. 3 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. As will be explained further below, the present apparatus uses height map data also to supplement the alignment measurements.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Figure 4:
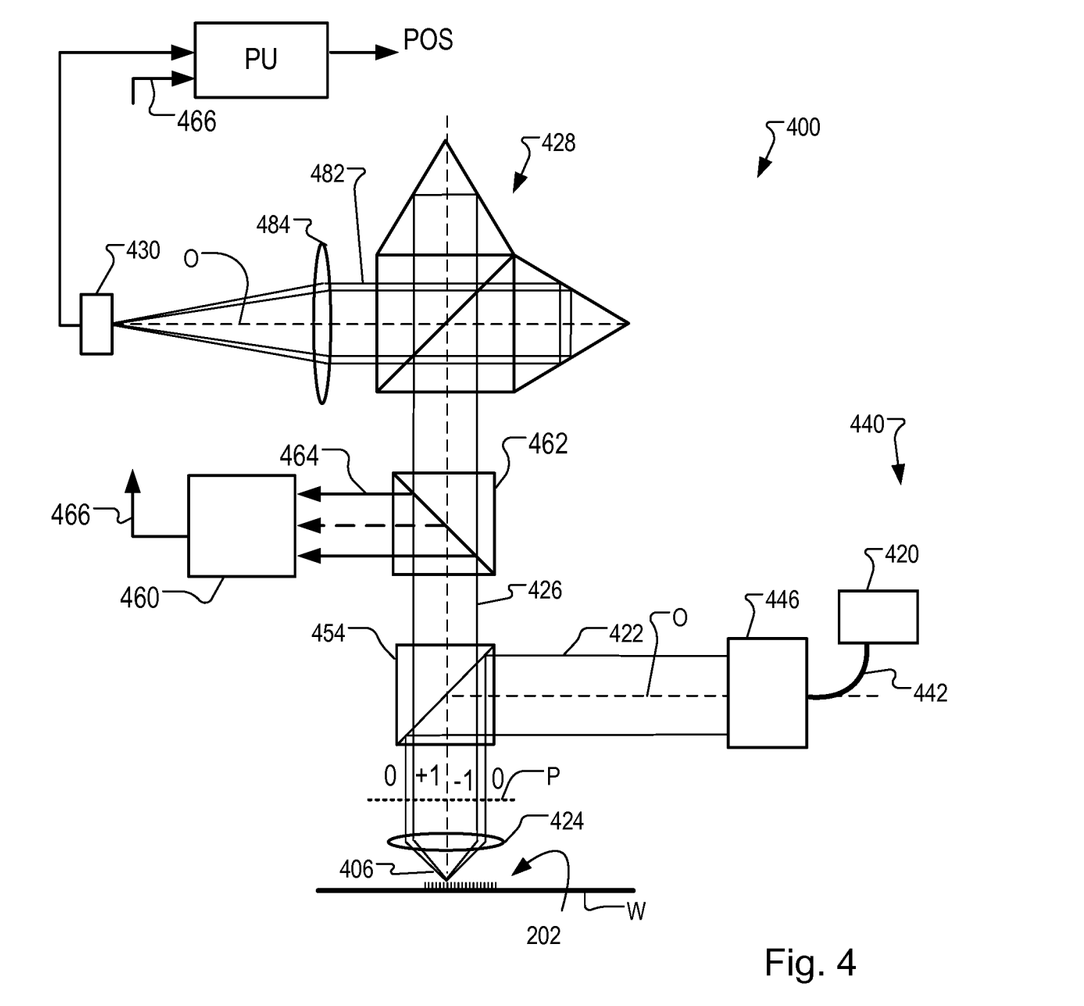
FIG. 4 an alignment sensor used in the lithographic apparatus of FIG. 1.

FIG. 4 illustrates an optical system 400 of an alignment sensor. An optical axis O which has several branches is indicated by a broken line running throughout the optical system 400. The optical system has a radiation source 420, an illumination beam 422, an objective lens 424, an information carrying beam 426, a self-referencing interferometer 428 and a detector 430. In practice, multiple detectors may be provided. Signals from the detector are processed by processing unit PU.

Additional components illustrated in this schematic diagram are as follows. In an illumination subsystem 440, radiation from source 420 is delivered via an optical fiber 442 to an illumination profiling optic 446. This delivers input beam 422 via beam splitter 454 to objective lens 424 having a pupil plane P. Objective lens 424 forms a spot 406 on alignment mark 202 formed on substrate W. The substrate is positioned on a substrate stage (not shown), which may be moved relative to the optical system. The skilled person will, of course, realise that the relative movement can be implemented in a number of specific ways. In one example the optical system is stationary and the stage moves. In another example, the optical system moves and the stage is stationary. In yet another example, the stage moves in at least one dimension, and the optical system moves in at least one other dimension.

Information-carrying beam 426, diffracted by the mark, passes through beam splitter 454 to interferometer 428. Interferometer 428 splits the radiation field into two parts with orthogonal polarization, rotates these parts about the optical axis by 180° relative to one another, and combines them into an outgoing beam 482. A lens 484 focuses the entire field onto a detector 430. The detector 430 in this example and in the alignment sensor are effectively single photodiodes and do not provide any spatial information except by the scanning motion described already. A detector having spatial resolution in a conjugate pupil plane can be added, to allow an angle-resolved scatterometry method to be performed using the alignment sensor hardware.

Included in the present example is an asymmetry measuring arrangement 460. Arrangement 460 receives a part 464 of the information carrying beam 426 through a second beam splitter 462 positioned in advance of the interferometer 428.

It should be noted that in the example shown in FIG. 4 some optical elements used in practice around the interferometer have been omitted. This is only done to simplify the explanation of this idea. In a real implementation they may need to be included.

As described above, the alignment marks used by the alignment sensor may become obscured or invisible to the light beams used during the alignment process. One or several of the layers deposited on top of the alignment marks may be wholly or partially opaque to the light beams used by the alignment sensor.

Figure 5:
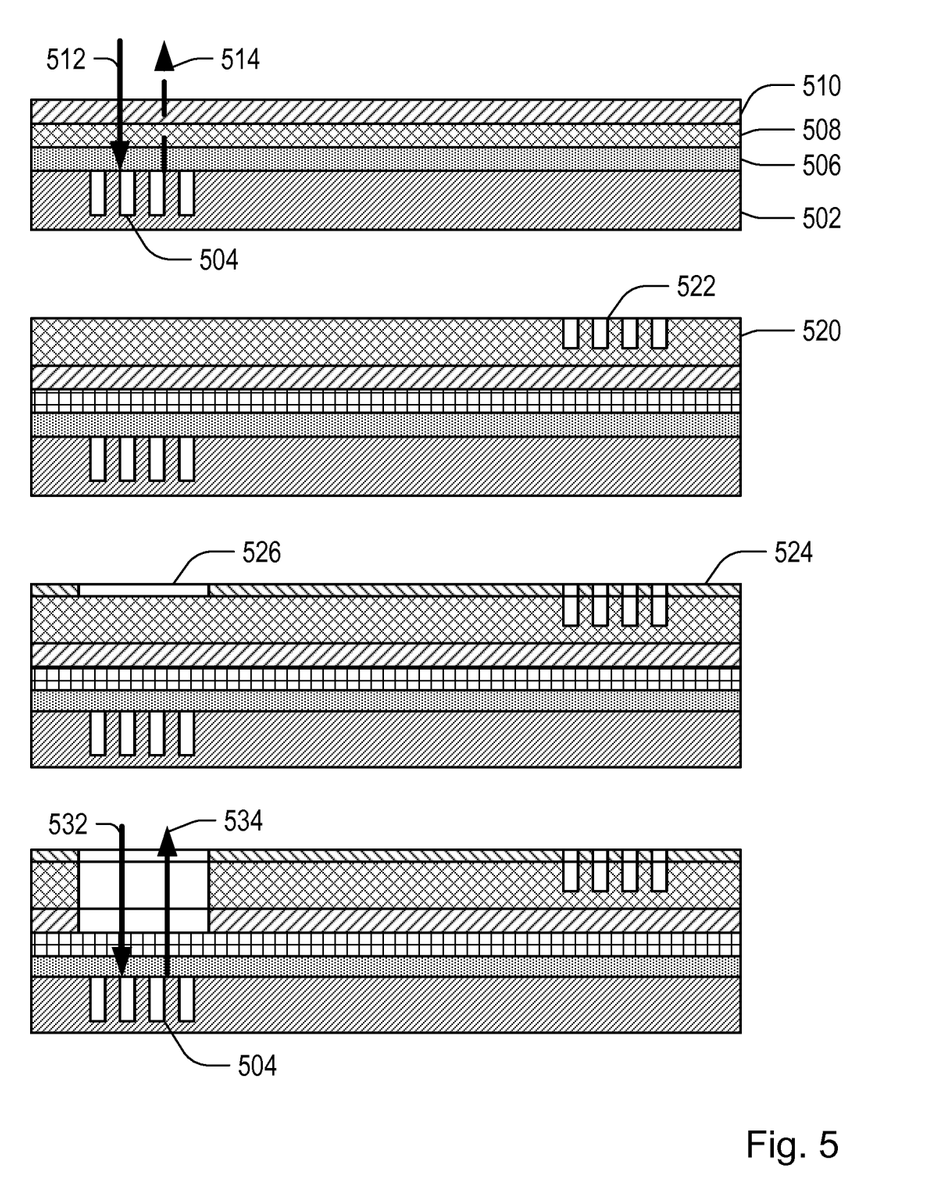
FIG. 5 illustrates schematically the steps of a method of increasing visibility of alignment marks on a substrate.

FIG. 5 shows a known method for overcoming this problem. A substrate 502 has a number of alignment marks 504 on its surface. A number of layers 506, 508, 510 have been deposited during the lithographic process. One or more of the layers may be partially or wholly opaque to incoming light beams 512. It may therefore not be possible to use any scattered light beams 514 to detect the position of the alignment marks. Effectively, the alignment marks may be invisible to the radiation used by the alignment sensor.

In order to render the alignment marks visible to the alignment sensor, it is necessary to remove at least some of the layers on top of the alignment mark. In order to accomplish this, an additional layer 520 is deposited onto the substrate. The additional layer comprises a set of additional alignment marks 522.

The additional alignment marks are then used in the alignment of a further layer 524 that is subsequently deposited onto the substrate. The further layer comprises an optical window 526 (also referred to as a "clear out window"). The optical window is aligned with the alignment marks 504 and is dimensioned so as to cover the entirety of the alignment mark. Ideally, the optical window is dimensioned so as to match the size of the alignment marks within a small tolerance. This avoids using valuable surface space on the substrate. For this reason, the optical window needs to be in alignment with the alignment marks.

Subsequently, material from the underlying layers 506, 508, 510 can be removed in a suitable manner. Material from one or several of the underlying layers can be removed, dependent on the optical properties of the underlying layers. When the one or more layers have been removed, an incoming light beam 532 will be scattered by the alignment marks 504 such that the information carrying beam 534 is detectable by the detector of the alignment sensor.

The above-described process is time consuming and requires that the additional marks and the optical window are aligned within a tight tolerance. This, in turn, requires careful control of the lithographic process, which negatively impacts production speed of the lithographic apparatus.

Figure 6:
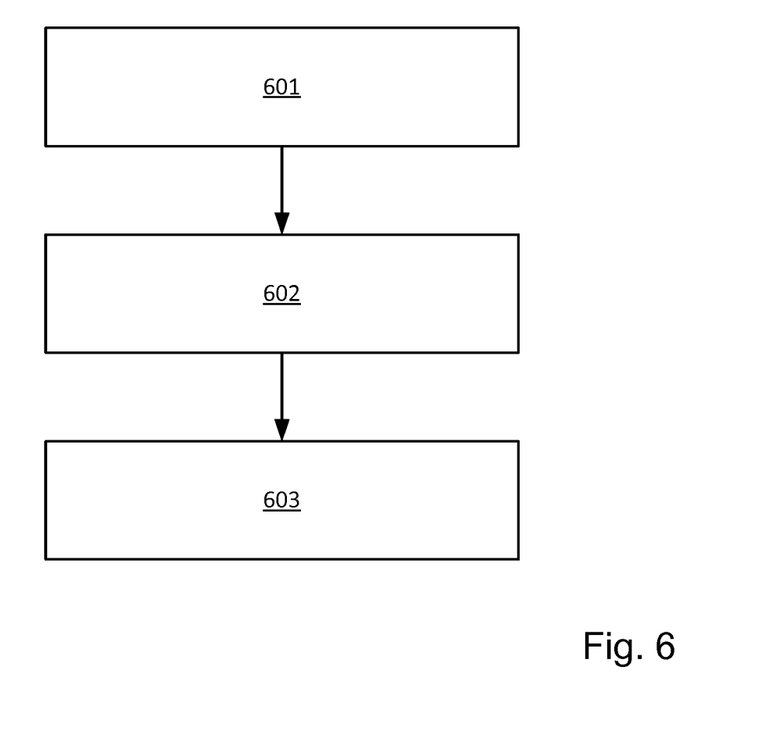
FIG. 6 illustrates an exemplary method for increasing visibility of alignment marks on a substrate according to the invention.

FIG. 6 shows an exemplary processing method to overcome the above disadvantages. In a first step 601, one or more first quantities of a substrate are determined. In a second step 602, one or more second quantities of the substrate are determined. The first and second quantities may in one example be physical parameters relating to the substrate. This includes, but not limited to, the position of a point on the edge of the substrate; or the position of a notch on the substrate. In a third step, the substrate is aligned 603 in the lithographic apparatus based on the first and second quantities. After the substrate is aligned, any necessary processing, such as adding the above-described optical window, can be carried out. The exemplary method thereby obviates the need for adding additional layers and alignment marks.

It will of course be appreciated that the exemplary method can be used more generally to aid with the alignment or positioning of a substrate in a lithographic apparatus without the use of alignment marks.

Figure 7:
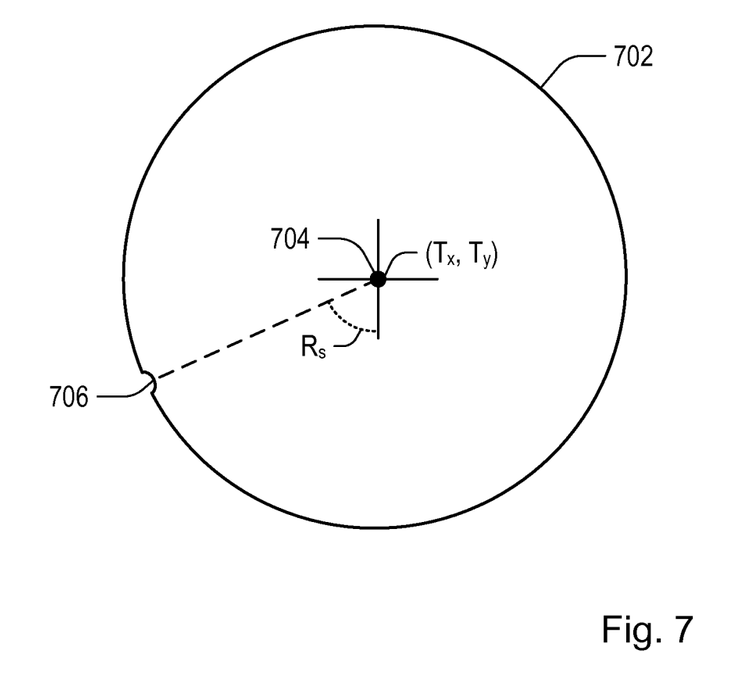
FIG. 7 depicts an exemplary substrate and a set of exemplary parameters determined by the exemplary method.

FIG. 7 depicts a set of exemplary substrate parameters that can be determined by the exemplary method by measuring the first and second quantities as described above. These parameters are used by the lithographic apparatus during the lithographic process to align the substrate. A substrate 702 has a center point 704 with coordinates Tx and Ty (for the x and y coordinates respectively), and a notch 706. In the present example, the notch is circular in shape, although it will be appreciated that the notch could have any suitable geometric shape and size. It is to be noted that the size and shape of a particular notch may be standardized for a particular size and/or shape of substrate, and may therefore be used to identify the type of substrate being measured. In order to align a particular substrate, it is necessary to know the orientation of the substrate in addition to the center position. The orientation of the substrate is denoted by the parameter Rs. This parameter is derived by determining the angle of the imaginary line between the center point of the substrate and the notch of the substrate. In the present example, the angle is defined with respect to the y-axis, but it could in principle be defined with respect to any suitable axis that intersects the center of the substrate.

Figure 8:
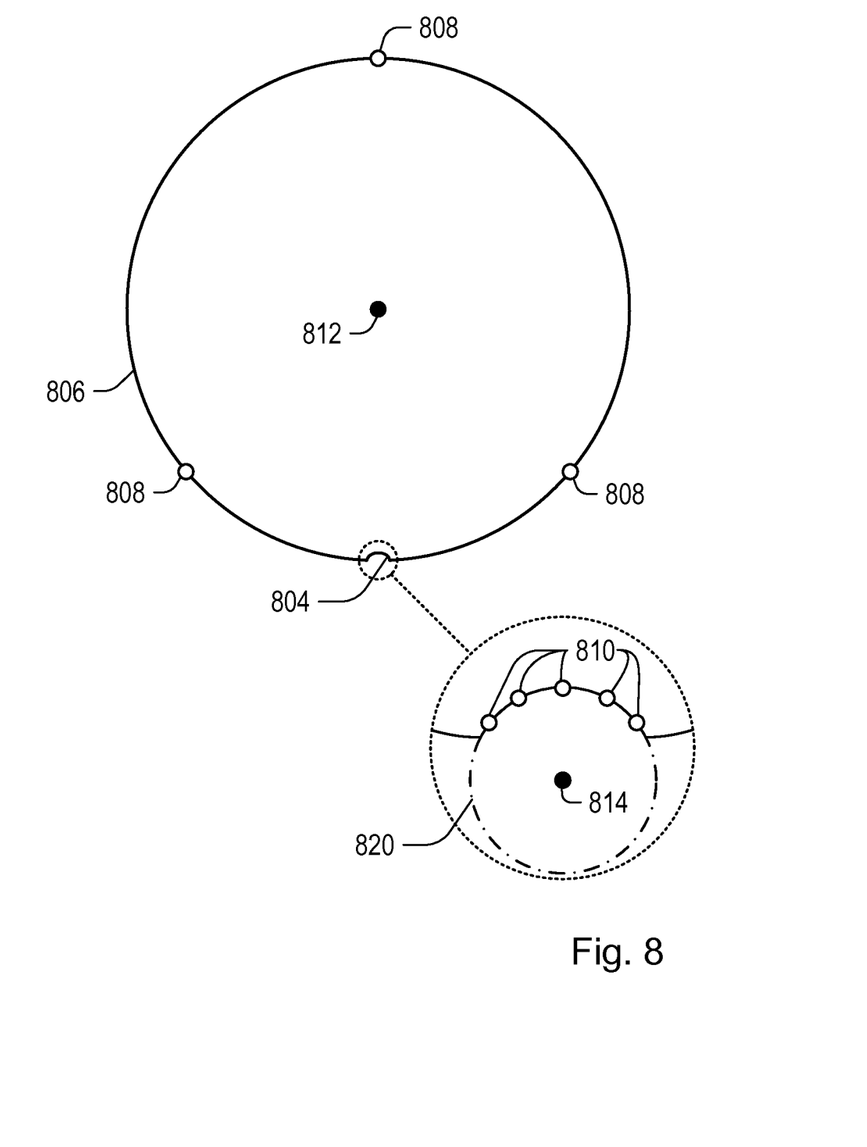
FIG. 8 depicts a set of points to be measured in a second exemplary method according to the invention.
Figure 9:
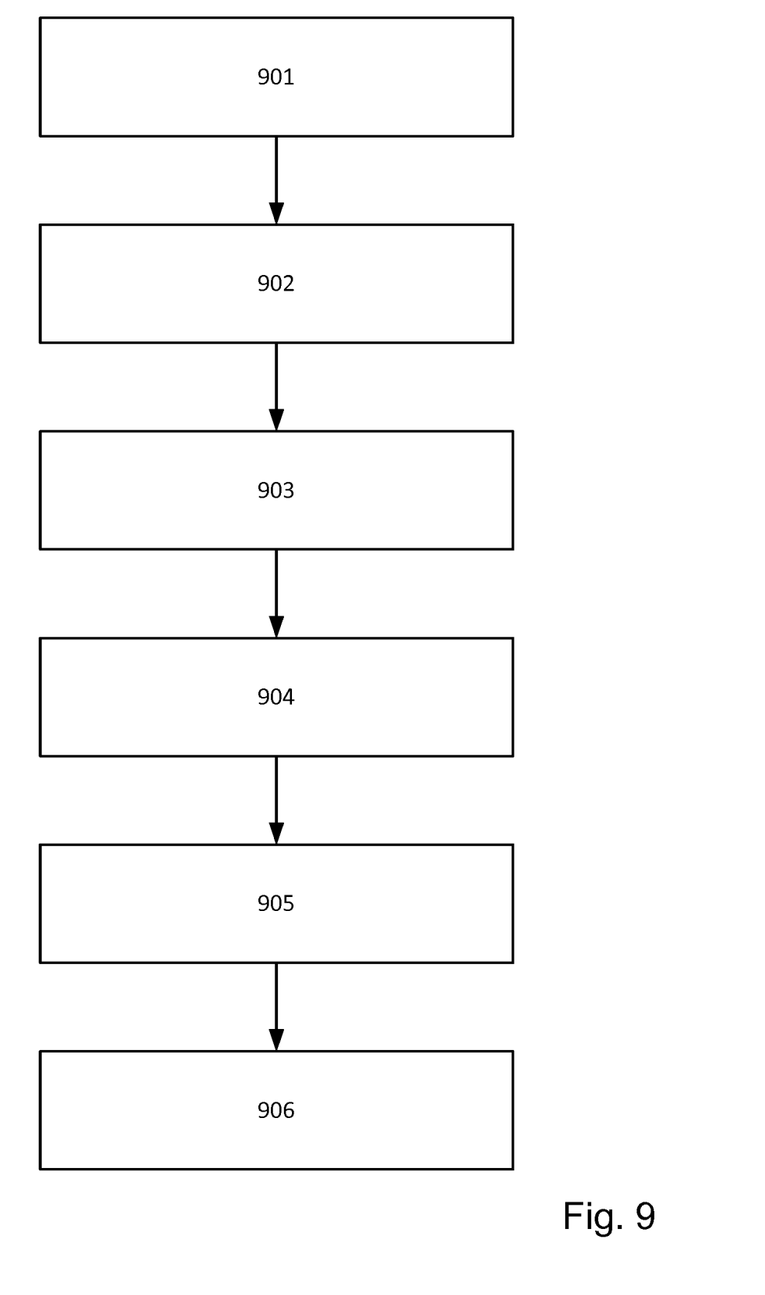
FIG. 9 depicts the second exemplary method for increasing visibility of alignment marks on a substrate.

A second exemplary processing method will now be described with reference to FIGS. 8 and 9. An exemplary substrate 802 has a circular notch 804 substantially similar to illustrated in FIG. 7.

In a first step 901, the position of a plurality of points 808 on the edge of the substrate 806 is determined. In the present example, three points are used. The points are distributed substantially equally along the edge of the substrate. In principle, however, any suitable number of points could be used, which have any suitable distribution along the edge of the substrate. As each point to be measured increases the time required to perform the alignment, it is desirable to use as few points as possible in order to accurately determine the center position of the substrate. It has been found that three points are sufficient to accurately determine the center position of a substantially circular substrate. However, examples may be envisaged where a smaller or larger number of points are used to determine the center position of substrates with other, or more complex, geometries.

In a second step 902, the position of a second plurality of points 810 along the edge of the notch 804 is determined. The determination may be carried out in the same fashion as for the edges of the substrate in the first step. Alternatively, any other suitable method may be used to determine the position of the second plurality. In the present example, the positions of five points are determined, although this is exemplary only. As described above, it is desirable to perform as few measurements as possible in order to reduce the time required to carry out the alignment process.

In a third step 903, the center position of the substrate is determined based on the determined positions of the points 808 on the edge of the substrate. In the present example, a substantially circular substrate is used. However, embodiments where non-circular substrates are used may equally well be envisaged.

In a fourth step 904, a center position of the notch is determined based on the determined positions of the points 810 on the edge of the notch. In addition to the determined points, it is necessary to know the geometric shape of the notch. In the present example, the notch is substantially circular in shape (as indicated by circle 820). Hence, the center position of the notch is the nominal center of the circle. In other examples, the notch may have any one of a number of possible shapes. The notch may, without limitation, be a triangle, or may be formed as a flat edge of the substrate. Other shapes may of course be envisaged. It is to be noted that the shape and size of a notch is typically pre-defined for a particular type or size of substrate, as described above.

The center positions of the substrate and the notch are then used to derive 905 the orientation Rs of the substrate. The determined center position of the substrate and the determined orientation of the substrate may subsequently be used in further processing steps 906, e.g. as a reference for determining the position of one or more alignment marks on the surface of the substrate.

Figure 10:
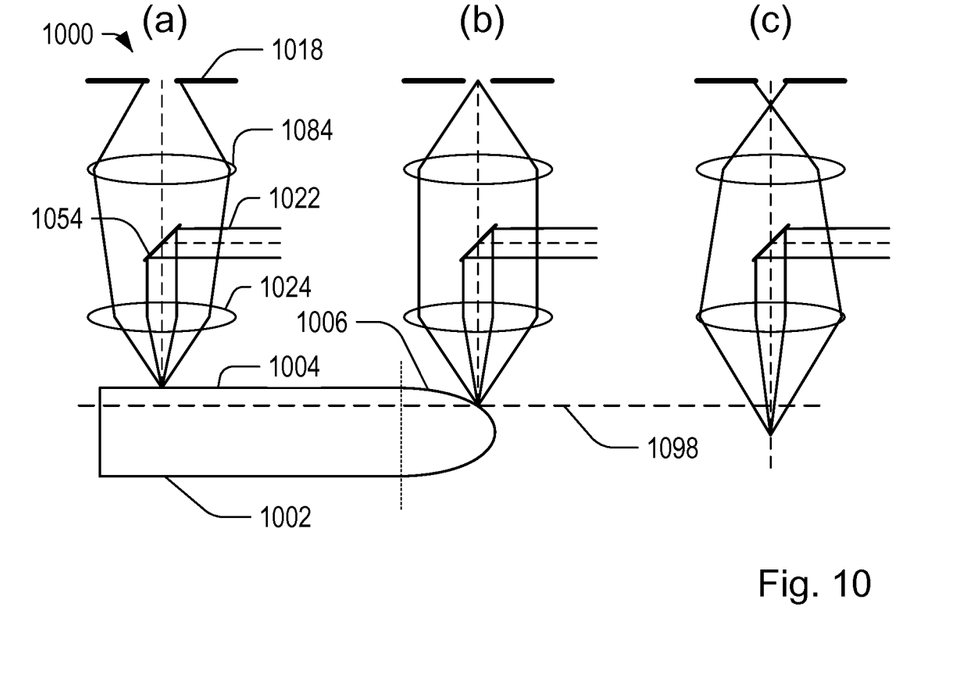
FIG. 10 depicts schematically the principle of an optical system used to carry out the exemplary method.

FIG. 10 shows a schematic illustration of an exemplary measurement setup. In this example, the optical system of the alignment sensor shown in FIG. 4 is used to perform the measuring steps of the method. For ease of comparison with the schematic diagram of FIG. 4, some parts of the alignment sensor 1000 are labeled with reference signs similar to those used in FIG. 4, but with prefix "10" instead of "4".

In the present example, a substrate 1002 has a central surface 1004, on which products may be formed, and an edge surface 1006. The edge surface may be beveled or curved (as shown in FIG. 10).

The optical system 1000 has an illumination source (not shown), which emits an illumination beam 1022. The illumination beam is reflected by the beamsplitter 1054 and propagates through an objective lens 1024 towards the surface of the substrate 1002. The objective lens has a focal length (indicated by dashed line 1098). The substrate is arranged relative to the optical system such that at least a portion of the edge surface is positioned closer to the objective lens 1024 than the focal length of the lens.

The illumination beam is scattered by the surface of the substrate and at least a portion is received by the objective lens. The scattered radiation (which is analogous to the information carrying beam of FIG. 4) then propagates through the optical system 1000, passing through the optical elements already described with respect to FIG. 4. A lens 1084 focuses the scattered radiation towards a detector (not shown). Immediately in front of the detector is positioned an aperture 1018, which is intended to eliminate most of the radiation from outside the spot on the substrate during alignment measurements. In effect, the detector of the optical system 1000 will only detect light reflected by objects positioned at the focal point of the objective lens 1024.

The principle of using the optical system 1000 for edge detection will now be explained. In order to detect an edge of the substrate, the optical system moves relative to the substrate in order to scan the light beam across the surface of the substrate. It should be noted that it is immaterial for purposes of the present disclosure whether the optical system moves or whether the substrate moves. In some examples, the optical system may move and the substrate may be stationary. In other examples, the optical system may be stationary and the substrate may move. In yet other examples, both the optical system and the substrate move along one or more axes.

FIG. 10(*a*) depicts the situation where the optical system is scanned across the central surface 1004 of the substrate 1002. The illumination beam is directed towards the surface of the substrate and is scattered by the surface, upon which the scattered radiation propagates through the optical system towards the detector, as explained above. As the central surface of the substrate is not at the focal point of the objective lens, the scattered radiation is not focused into the aperture by the lens.

FIG. 10(*b*) shows a situation in which the detector receives radiation scattered by a part of the edge surface 1006 of the substrate 1002 that is located at the focal point of the objective lens. The scattered radiation is focused into the aperture by the lens 1084, as explained above. In this situation, the optical system functions in a manner analogous to that described with reference to FIG. 4, and will therefore detect the presence of an edge of the substrate.

FIG. 10(*c*) shows a situation where the optical system has moved over the edge of the substrate. It should be noted that the radiation beams shown are for a situation where radiation is actually scattered a surface of the substrate, e.g. the edge surface immediately to the right of the situation shown in FIG. 10(*b*). It will, of course, be appreciated that no radiation will be received by the detector of the optical system if there is no surface to scatter the light beam emitted by the illumination source towards the detector. As shown in the Figure, radiation scattered by a surface that is outside the focal length of the objective lens will not be focused through the aperture and onto the detector, similarly to the situation in FIG. 10(*a*).

It will of course be appreciated that the specific implementation of the method described above is exemplary only, and that other implementations of the method may be envisaged.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of processing a substrate in a lithographic apparatus, wherein the substrate is positioned on a substrate table configured to move relative to a patterned radiation beam for controllably exposing the substrate to the patterned radiation beam, the substrate comprising an edge and a notch and wherein the processing comprises:
   determining one or more first quantities indicative of a first location of the edge of the substrate;
   determining one or more second quantities indicative of a second location of the notch; and
   aligning the substrate within the lithographic apparatus based on the one or more first quantities and the one or more second quantities;
   wherein the lithographic apparatus comprises a detector with a focal point with a focal length, the detector being arranged to detect light scattered by objects located at the focal point, and wherein the step of determining one or more first quantities comprises:
   arranging the substrate relative to the detector such that a distance of a surface of the substrate is smaller than the focal length of the detector and such that a distance between the detector and at least a first portion of the edge of the substrate is substantially equal to the focal length of the detector;
   illuminating the edge of the substrate;
   receiving light scattered by the edge of the substrate; and
   detecting the presence of the edge when the detector receives light scattered by the first portion of the edge of the substrate.

2. A method according to claim 1, wherein the step of determining one or more first quantities comprises determining the position of a plurality of points on the edge of the substrate.

3. A method according to claim 2, further comprising determining a center position of the substrate based at least in part on determining the position of a plurality of points on the edge of the substrate.

4. A method according to claim 2, wherein determining one or more second quantities comprises determining the position of a plurality of points on an edge of the notch.

5. A method according to claim 4, further comprising:
   deriving the center position of the notch based on the determined plurality of points; and
   deriving the orientation of the substrate based on the center position of the notch.

6. A method according to claim 4, wherein the step of determining one or more second quantities comprises:
   arranging the substrate relative to the detector such that distance of the surface of the substrate is smaller than the focal length of the detector and such that the distance between the detector and at least a first portion of the edge of the notch is substantially equal to the focal length of the detector;
   illuminating the edge of the notch;
   receiving light scattered by the edge of the notch; and
   detecting the presence of the edge of the notch when the detector receives light scattered by the first portion of the edge of the notch.

7. A lithographic apparatus comprising:
   a substrate table for receiving a substrate, the substrate table being operable to move relative to a patterned radiation beam for controllably exposing the substrate to the patterned radiation beam, the substrate comprising an edge and a notch;
   an optical system operable to determine one or more first quantities indicative of a first location of the edge of the substrate, and operable to determine one or more second quantities indicative of a second location of the notch;
   wherein the substrate table is further operable to align the substrate within the lithographic apparatus based on the one or more first quantities and the one or more second quantities;
   a detector with a focal point and a focal length, the detector being operable to detect light scattered by objects located at the focal point,
   wherein the substrate table is further operable to arrange the substrate relative to the detector such that a distance of a surface of the substrate is smaller than the focal length of the detector and such that a distance between the detector and at least a first portion of the edge of the substrate is substantially equal to the focal length of the detector, and
   wherein the optical system is further operable to:
   illuminate the edge of the substrate;
   receive light scattered by the edge of the substrate; and detect the presence of the edge of the substrate when the detector receives light scattered by the first portion of the edge of the substrate.

8. A lithographic apparatus according to claim 7, wherein the optical system is further operable to determine the position of a plurality of points on the edge of the substrate.

9. A lithographic apparatus according to claim 8, wherein the optical system is further operable to determine a center position of the substrate.

10. A lithographic apparatus according to claim 8, wherein the optical system is further operable to determine the position of a plurality of points on an edge of the notch.

11. A lithographic apparatus according to claim 10, further comprising a processing unit, the processing unit being operable to:
   derive the center position of the notch based on the determined plurality of points; and
   derive the orientation of the substrate based on the center position of the notch.

12. A lithographic apparatus according to claim 7, wherein the substrate table is further operable to arrange the substrate relative to the detector such that the distance between the detector and at least a first portion of the edge of the notch is substantially equal to the focal length of the detector, and wherein the optical system is further operable to:
   illuminate the edge of the notch;
   receiving light scattered by the edge of the notch; and
   detect the presence of the edge of the notch when the detector receives light scattered by the first portion of the edge of the notch.

13. A lithographic apparatus according to claim 7, further comprising an alignment sensor comprising the optical system wherein the alignment sensor is arranged to measure a position of one or more alignment markers on the substrate.

* * * * *

UNITED STATES PATENT AND TRADEMARK OFFICE
CERTIFICATE OF CORRECTION

PATENT NO. : 10,527,957 B2
APPLICATION NO. : 15/778517
DATED : January 7, 2020
INVENTOR(S) : Cayetano Sanchez-Fabres Cobaleda

It is certified that error appears in the above-identified patent and that said Letters Patent is hereby corrected as shown below:

On the Title Page

Item (72) Column 1, Line 4:
Address of the Inventor Fransciscus Godefridus Casper Bijnen reads:
Valkenswaard (BE)

Should read:
Valkenswaard (NL)

Signed and Sealed this
Twenty-fifth Day of February, 2020

Andrei Iancu
*Director of the United States Patent and Trademark Office*